US007924026B2

(12) United States Patent
Horn et al.

(10) Patent No.: US 7,924,026 B2
(45) Date of Patent: Apr. 12, 2011

(54) METHOD AND APPARATUS FOR DETERMINING A RESPONSE OF A DUT TO A DESIRED LARGE SIGNAL, AND FOR DETERMINING INPUT TONES REQUIRED TO PRODUCE A DESIRED OUTPUT

(75) Inventors: Jason M. Horn, Santa Rosa, CA (US);
David E. Root, Santa Rosa, CA (US);
Daniel Gunyan, Rohnert Park, CA (US);
Jianjun Xu, Petaluma, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 414 days.

(21) Appl. No.: 12/054,258

(22) Filed: Mar. 24, 2008

(65) Prior Publication Data

US 2009/0237069 A1 Sep. 24, 2009

(51) Int. Cl.
*G01R 23/20* (2006.01)
*G06F 17/50* (2006.01)

(52) U.S. Cl. ............ 324/638; 324/623; 324/624; 703/13

(58) Field of Classification Search .................. 324/638, 324/620–626; 703/13
See application file for complete search history.

(56) References Cited

U.S. PATENT DOCUMENTS

| 7,038,468 | B2 | 5/2006 | Verspecht |
| 7,295,961 | B2 | 11/2007 | Root et al. |
| 2006/0161409 | A1* | 7/2006 | Root et al. ..................... 703/13 |

OTHER PUBLICATIONS

Lashkari, Khosrow, Exact Linearization of Wiener and Hammerstein System (Loudspeaker Linearization), Media Lab, DoCoMo USA Laboratories, Inc. ICICS 2005.*
D.E. Root, et al., "Broad-Band, Poly-Harmonic Distortion (PHD) Behavioral Models from Fast Automated Simulations and Large-Signal Vectorial Network Measurements", IEEE Transacactions on Microwave Theory and Techniques vol. 53, No. 11, Nov. 2005 pp. 3656-3664.
J. Verspecht, et al., "Broad-Band Multi-Harmonic Frequency Domain Behavioral Models from Automated Large-Signal Vectorial Network Measurements," 2005 IEEE MTT-S Int. Microwave Symp. Dig., Long Beach, CA, USA, Jun. 2005, pp. 1975-1978.
J. Verspecht, et al., "Poly-Harmonic Distortion Modeling," in IEEE Microwave Theory and Techniques Microwave Magazine, Jun. 2006, pp. 44-57.
J. Verspecht, et al., "Multi-Tone, Multi-Port, and Dynamic Memory Enhancements to PHD Nonlinear Behavioral Models from Large-signal Measurements and Simulations," in 2007 IEEE MTT-S Int. Microwave Symp. Dig., Hawaii, Jun. 2007. pp. 969-972.
A. Soury, et al., "Behavioral Modeling of RF and Microwave Circuit Blocks for Hierarchical Simulation of Modern Transceivers", 2005 IEEE MTT-S Int. Microwave Symp. Dig. Jun. 2005.

(Continued)

*Primary Examiner* — Timothy J Dole
*Assistant Examiner* — Farhana Hoque

(57) ABSTRACT

A method for determining input tones required to produce a desired output includes the step of extracting a linearization of a spectral map representing a device under test (DUT) that i) is under drive of a large signal having one or more fundamental frequencies with associated amplitudes and phases, and ii) produces an approximation of a desired output having at least one unwanted spectral component. The method includes the further step of using an inverse of the extracted linearization to determine the input tones required to produce the desired output under a given load condition.

20 Claims, 8 Drawing Sheets

OTHER PUBLICATIONS

P. Blockney, et al., "Mixer-Based, Vector-Corrected, Vector Signal/Network Analyzer Offering 300kHz-20GHz Bandwidth and Traceable Phase Response," Microwave Symposium Digest, 2005 IEEE MTT-S International, Jun. 2005, pp. 1497-1500.

Nicholas B. Tufillaro, et al., "Methods and Apparatus for Computing and Using a Spectral Map for Performing Nonlinear Calibration of a Signal Path,", U.S. Appl. No. 12/004,442, filed Dec. 18, 2007.

* cited by examiner

METHOD AND APPARATUS FOR DETERMINING A RESPONSE OF A DUT TO A DESIRED LARGE SIGNAL, AND FOR DETERMINING INPUT TONES REQUIRED TO PRODUCE A DESIRED OUTPUT

BACKGROUND

It is often of interest to characterize a nonlinear device, such as a diode, transistor, or nonlinear circuit, by stimulating it using one or two pure, large-amplitude sinusoidal signals. In the former, the device responds with a harmonic series. In the later, the device converts the input signal into a spectrum containing energy at intermodulation frequencies. Some exemplary nonlinear quantities that are measured using such one and two-tone stimuli are harmonic distortion, third-order intercept (TOI), and third-order inter-modulation (IM3).

Because superposition is generally not valid for nonlinear devices, the characterization of nonlinear devices depends critically on the nature of the input signals used for their characterization. However, the spectral content of an input signal is often imperfect. That is, when a signal source is asked to provide an ideal sinusoid at a given frequency, f, it actually provides a signal that contains unwanted spectral components at small (complex) amplitudes, at frequencies corresponding to k*f (where k is a positive integer). The unwanted spectral components are often created by the source's output amplifier(s) or mixer(s).

When a device is stimulated with an imperfect input signal, its output is a combination of i) a response to a desired input signal, and ii) a response to the unwanted frequency components that contaminate the desired input signal. Thus, without a way to calibrate the source that provides the input signal, or without a way to correct the measured response of the device, it is impossible to know whether the device's response is the result of i) an intrinsic property of the device, or ii) an imperfect stimulus.

Most current solutions for calibrating nonlinear instruments, such as Nonlinear Vector Network Analyzers (NV-NAs) and Large-Signal Network Analyzers (LSNAs), involve crude corrections for gain compression, applied only at the fundamental frequency. There is no rigorous and time-effective procedure for calibrating a source or receiver for unwanted signal components (such as energy at harmonics or intermodulation frequencies of a desired input signal, or reflections due to imperfect load matches at the ports of a device). Even active device measurement applications, such as intermodulation applications (e.g., third-order intercept (IP3) or intermodulation distortion (IMD) applications) are not calibrated for imperfect stimuli, and therefore fail to correct for mismatch at the fundamental or intermodulation frequencies.

Given the scarcity of solutions for calibrating nonlinear instruments for imperfect stimuli, it is often necessary to characterize nonlinear devices using expensive sources that produce signals which are as close to ideal as possible.

BRIEF DESCRIPTION OF THE DRAWINGS

Demonstrative embodiments of the invention are illustrated in the drawings, in which.

DETAILED DESCRIPTION

Figure 1:
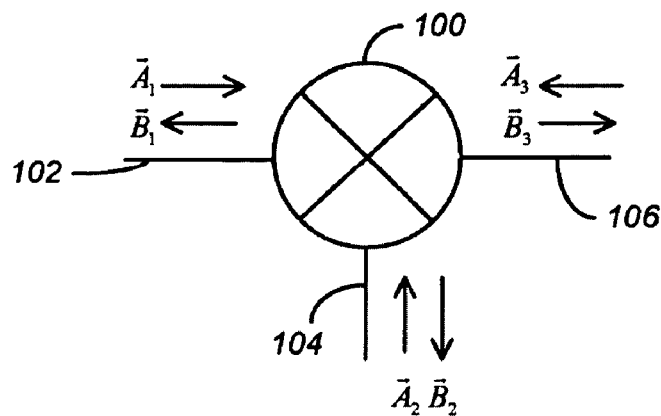
FIG. 1 illustrates an exemplary nonlinear device.

The methods and apparatus described herein may be used to model and characterize various types of devices having various types and numbers of ports. The methods and apparatus are particularly useful for characterizing nonlinear devices. By way of example, one such nonlinear device 100, having a pair of input ports 102, 104 and a single output port 106, is shown in FIG. 1.

Figure 2:
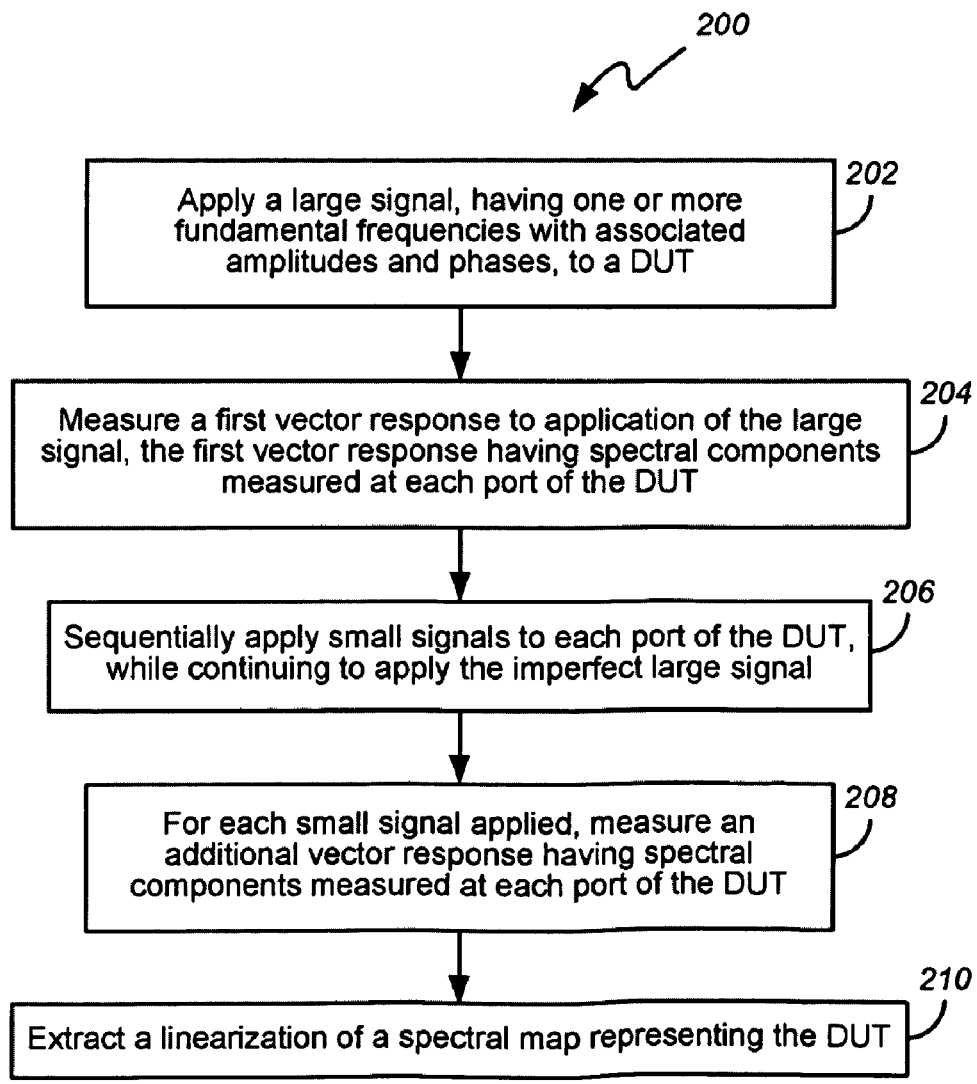
FIG. 2 illustrates an exemplary method for characterizing a device such as the device shown in FIG. 1.

FIG. 2 illustrates an exemplary method 200 for characterizing a device such as the device 100. The method 200 begins with the application of a large signal, having one or more fundamental frequencies with associated amplitudes and phases, to a device under test (DUT) (at block 202). A vector response to application of the large signal is then measured (at block 204). The vector response comprises spectral components that are measured at each port of the DUT. At block 206, a plurality of small signals is sequentially applied to each port of the DUT, while continuing to apply the large signal. For each small signal applied, an additional vector response is measured (at block 208). As with the vector response to the large signal alone, each of the additional vector responses comprises spectral components that are measured at each port of the DUT. The method 200 concludes with the extraction, from the vector responses, of a linearization of a spectral map representing the DUT (at block 210). The linearization of the spectral map is extracted from the vector responses to the large and small signals that are applied to the DUT. In some embodiments, extracting the linearization of the spectral map may comprise identifying a poly-harmonic distortion (PHD) model, or X-parameters, for the DUT. See, for example, D. E. Root, J. Verspecht, D. Sharrit, J. Wood, and A. Cognata, "Broad-Band, Poly-Harmonic Distortion (PHD) Behavioral Models from Fast Automated Simulations and Large-Signal Vectorial Network Measurements," *IEEE Transactions on Microwave Theory and Techniques*, Vol. 53. No. 11, pp. 3656-3664 (November 2005). See also, 1) J. Verspecht, D. E. Root, J. Wood, A. Cognata, "Broad-Band Multi-Harmonic Frequency Domain Behavioral Models from Automated Large-Signal Vectorial Network Measurements," 2005 IEEE MTT-S Int. Microwave Symp. Dig., Long Beach, Calif., USA (June 2005); 2) J. Verspecht and D. E. Root, "Poly-Harmonic Distortion Modeling," *IEEE Microwave Theory and Techniques Microwave Magazine* (Jun. 2006); and 3) J. Verspecht, D. Gunyan, J. Horn, J. Xu, A. Cognata, and D. E. Root, "Multi-tone, Multi-port, and Dynamic Memory Enhancements to PHD Nonlinear Behavioral Models from Large-signal Measurements and Simulations," 2007 IEEE MTT-S Int. Microwave Symp. Dig., Hawaii, pp. 969-972 (June 2007).

For purposes of this description, a "large signal" component of a stimulus is defined as a signal component that is large enough to cause significantly nonlinear behavior in a DUT. A "small signal" component of a stimulus is defined as a signal component that is assumed to be small enough to yield an approximately linear or spectrally linear response from a DUT. The appropriate choice of large and small signal components depends on the nature of, and relationship between, a particular DUT and a desired stimulus. As used herein, a "DUT" is intended to include both singular devices or components, as well as collections of devices or components forming a circuit network or system.

Figure 3:
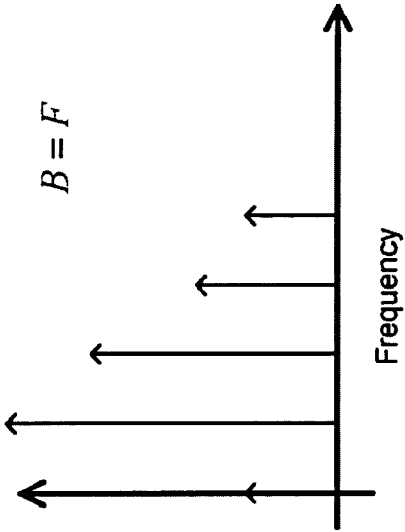
FIGS. 3-6 illustrate exemplary ideal inputs to, and responses from, a device under test.
Figure 4:
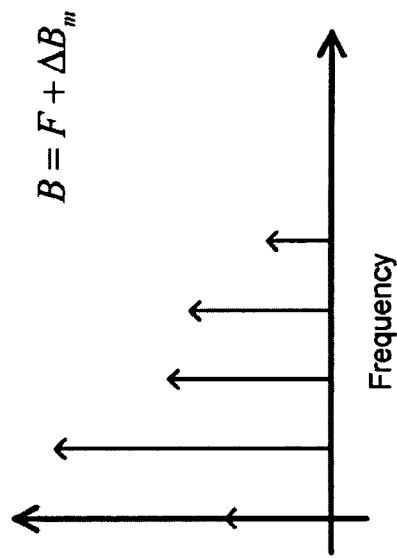
Figure 5:
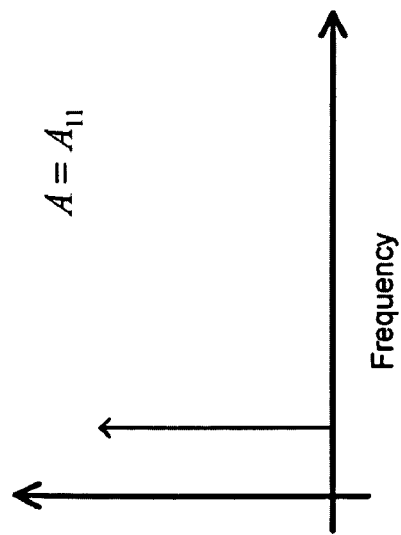
Figure 6:
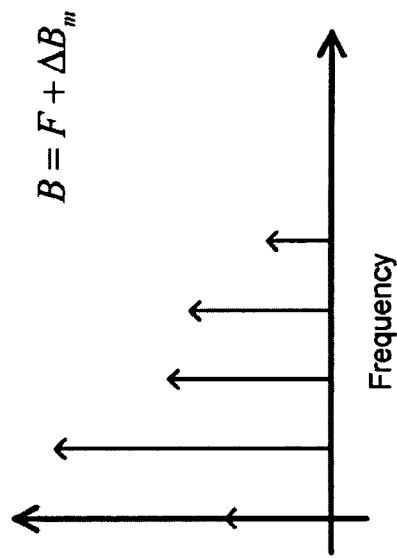

FIGS. 3-6 illustrate various "ideal" signals and responses that are applied and measured via the method 200. FIGS. 3 & 5 illustrate frequency domain magnitude representations of exemplary ideal input signals, A; and FIGS. 4 & 6 illustrate exemplary frequency domain magnitude representations of ideal responses, B. Looking at FIGS. 3-6 in more detail, FIG. 3 illustrates an exemplary large signal input, $A_{11}$; and FIG. 4 illustrates an exemplary response, F, to the large signal $A_{11}$. By way of example, the large signal input $A_{11}$ is shown to be a one-tone signal having a fundamental frequency and corresponding amplitude and phase. However, the large signal input could alternately be a multiple-tone signal (e.g., a two-tone or n-tone signal) having multiple fundamental frequencies, with each fundamental frequency having its own corresponding amplitude and phase.

FIG. 5 illustrates the exemplary large signal input, $A_{11}$, along with a small signal (or "tickler"), $\Delta A_m$, at the m th harmonic of $A_{11}$ (m=1,2, ...). FIG. 6 illustrates an exemplary response, $F+\Delta B_m$, to the stimulus $A_{11}+\Delta A_m$. $\Delta B_m$ represents the difference in response when a DUT is stimulated with a combination of large and small signals versus the large signal alone.

Unfortunately, the exemplary ideal input signals shown in FIGS. 3 & 5 are not easily produced, and the production of input signals approaching these ideal signals typically requires a very expensive source. In this regard, FIGS. 7-10 illustrate various ones of the signals and responses that might actually be applied and measured via the method 200.

Figure 7:
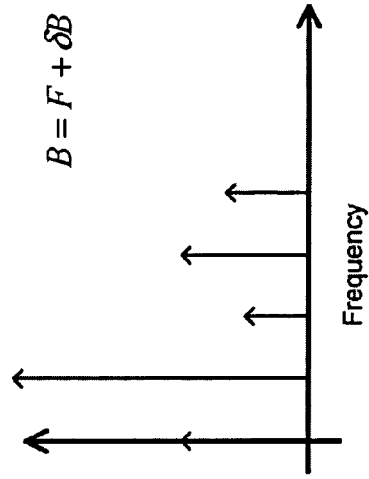
FIGS. 7-10 illustrate exemplary real (and imperfect) inputs to, and responses from, a device under test.
Figure 8:
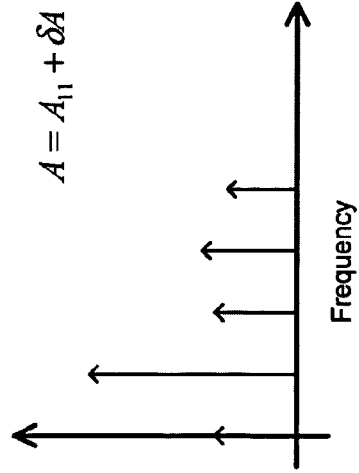

FIG. 7 illustrates an exemplary imperfect large signal input, $A_{11}+\delta A$; and FIG. 8 illustrates an exemplary response, $F+\delta B$, to the imperfect large signal $A_{11}+\delta A$. Here, $A_{11}$ is the desired large signal input, and $\delta A$ represents at least one unwanted spectral component (such as a signal having energies at all harmonics of the fundamental frequency of $A_{11}$, including DC). In some cases, the signal $\delta A$ may represent the unwanted spectral components that are generated by a non-ideal (or "dirty") source when driven hard (e.g., driven at high power levels). However, most any signal generated by a real source will be an imperfect (non-ideal) signal. The response component $\delta B$ is the response to the unwanted spectral component(s) $\delta A$.

Figure 9:
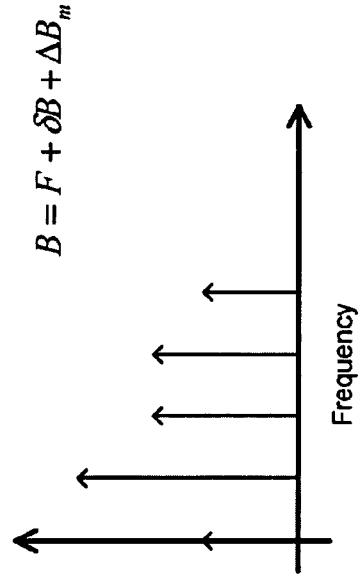
Figure 10:
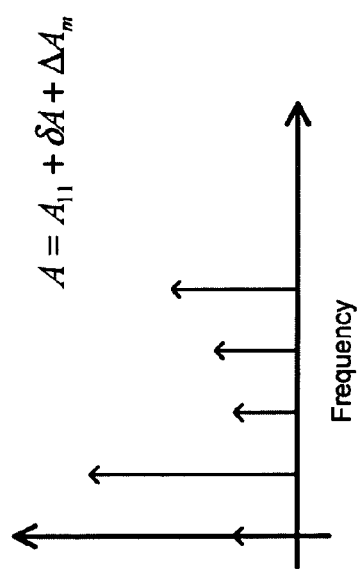

FIG. 9 illustrates the imperfect large signal $A_{11}+\delta A$, along with the small signal $\Delta A_m$ at the m th harmonic of $A_{11}$ (m=1,2, ... ). FIG. 10 illustrates an exemplary response, $F+\delta B+\Delta B_m$, to the stimulus $A_{11}+\delta A+\Delta A_m$.

In each of FIGS. 4, 6, 8 and 10, F is the response of a DUT to the ideal large signal $A_{11}$. The response F has harmonic components $F_k$, (k=1,2, ... ). $\Delta B_m$ is the incremental response of the DUT in the presence of both $A_{11}$ and a small signal $\Delta A_m$, where m is the m th harmonic of the fundamental frequency of $A_{11}$. For the ideal large signal $A_{11}$, applied to a DUT in the absence of $\delta A$, knowledge of $F_k$ and $\Delta B_m$ for all values of k and m, and application of the appropriate set of small signal stimuli $\Delta A_m$, is sufficient to identify a PHD model (or X-parameters) for the DUT, as discussed in the papers of D. E. Root, et al. and J. Verspecht, et al, mentioned supra. However, existing methodologies do not provide a way to identify $F_k$ and $\Delta B_m$, and therefore the X-parameters of a system, from the imperfect inputs and outputs shown in FIGS. 7-10.

Figure 11:
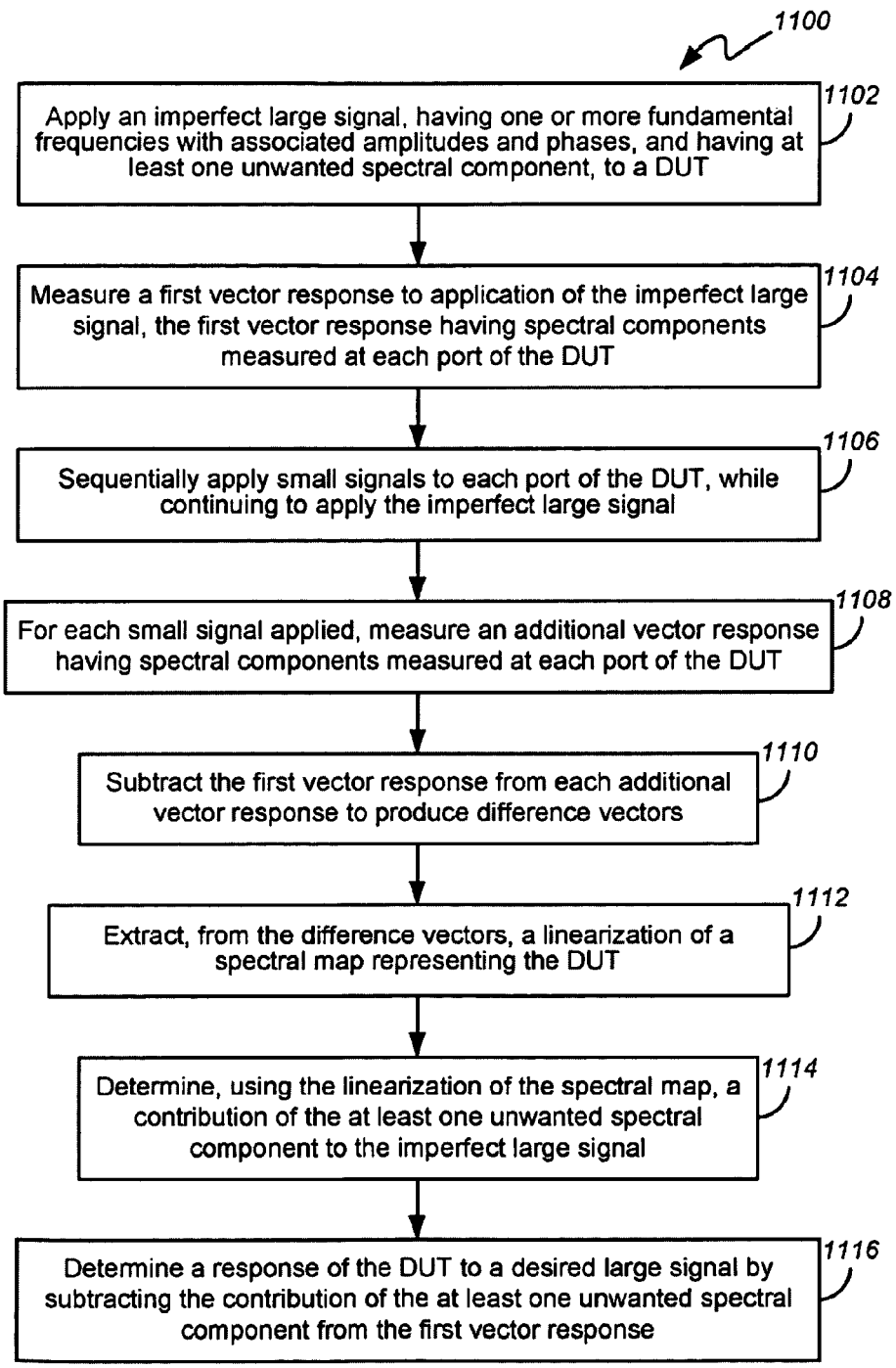
FIG. 11 illustrates a first exemplary method for determining a response of a device under test to a desired large signal.

Given the problem set forth in the above paragraph, FIG. 11 illustrates a first exemplary method 1100 for determining a response of a DUT to a desired large signal, after application of an imperfect large signal. The method 1100 begins with the application of an imperfect large signal, having one or more fundamental frequencies with associated amplitudes and phases, and having at least one unwanted spectral component, to a device under test (DUT) (at block 1102). A first vector response to application of the imperfect large signal is then measured (at block 1104). The first vector response comprises spectral components that are measured at each port of the DUT.

The method 1100 continues with the sequential application of a plurality of small signals to each port of the DUT (at block 1106). The small signals are applied while continuing to apply the imperfect large signal. For each small signal applied, an additional vector response is measured (at block 1108). As with the vector response to the imperfect large signal alone, each of the additional vector responses comprises spectral components that are measured at each port of the DUT.

The method 1100 comprises the further step of subtracting the first vector response from each of the additional vector responses, to produce difference vectors (at block 1110). A linearization of a spectral map representing the DUT is then extracted from the difference vectors (at block 1112). At block 1114, the linearization of the spectral map is used to determine (for example, compute) a contribution of the at least one unwanted spectral component to the imperfect large signal. Finally, a response of the DUT to a desired large signal is determined (and in most cases, estimated) by subtracting the contribution of the at least one unwanted spectral component from the first vector response (at block 1116).

Of note, the order of some of the steps in the method 1100 can be varied, and some steps may be performed in parallel with other steps (or may be started before other steps have completed).

An exemplary, more specific, implementation of the method 1100 is described below. For simplicity, DUT port indices are ignored. However, but for the large signal stimulus, stimuli and measurements are applied/made on a per port basis. Indices with subscripts are harmonic indices. The parenthetical superscripts correspond to experiment numbers (or the application of different stimuli).

In the implementation described below, it is assumed that the large signal that one desires to stimulate a DUT with is a pure sinusoidal signal having a fundamental frequency f. The desired large signal, in the spectral domain, is thus:

$$A_k^{(1)} = A_{11}^{(ideal)} \delta_{1k} \qquad \text{Eq. (1)}$$

However, given the reality that most signal sources are imperfect, the programming of a signal source to produce the desired large signal will typically result in the production of an imperfect large signal having small unwanted spectral components at harmonic frequencies in addition to the fundamental, or:

$$A_k^{(1)} = (A_{11}^{(ideal)} + \delta A_{11}) \delta_{1k} + \delta A_k \qquad \text{Eq. (2)}$$

Here, $\delta A_k$ is a component of the vector $\delta A$ of small tones at the k th harmonic of the fundamental frequency (although the method 1100 can be generalized to arbitrary unwanted spectral components). Note that the symbol $\delta$ is used in two contexts: 1) with subscripts as the Kronecker delta, $\delta_{jk}$, and 2) without subscripts to denote a small quantity, $\delta$.

In some embodiments of the method 1100, the step 1102 of applying an imperfect large signal to a DUT is carried out by applying the signal defined by Eq. 1 to the DUT.

Next, the signal defined by Eq. (2) may be applied to the DUT along with a small (complex) tickler signal at the m th harmonic, $\Delta A_m$ (for m=2,3, . . . ,N). N is the number of harmonics of interest. The special case of adding a tickler signal at m=1, at port one, is neglected for simplicity in notation and formalism.

The imperfect large signal, in combination with small tickler signals, is described by the following equation:

$$A_k^{(1+m)} = (A_{11}^{(ideal)} + \delta A_{11})\delta_{1k} + \delta A_k + \delta_{km}\Delta A_m \quad \text{Eq. (3)}$$

where m is a harmonic index.

The imperfect large signal may also be combined with small signals of orthogonal phase (as compared to those included in Eq. (3)). These additional combinations of large and small signals are described by the following equation:

$$A_k^{(1+N+m)} = \left(A_{11}^{(ideal)} + \delta A_{11}\right)\delta_{1k} + \delta A_k + \delta_{km} e^{j\frac{\pi}{2}}\Delta A_m \quad \text{Eq. (4)}$$

In some embodiments of the method 1100, the step 1106 of sequentially applying a plurality of small signals to a DUT, while still applying an imperfect large signal, is carried out by applying the signals defined by Eqs. (3) and (4) to the DUT.

Following application of the imperfect large signal, and following application of each of the small signals, a vector response of the DUT is measured in steps 1104 and 1108 of the method 1100.

Assuming the terms $\delta A$ and $\Delta A$ are small, a PHD model representation of the DUT can be defined in terms of X-parameters. That is, it can be assumed the following functions of $A_{11}$ can be determined:

$$X_k^{(F)}, X_{km}^{(S)}, X_{km}^{(T)}, \quad \text{Eq. (5)}$$

such that all inputs A can be mapped to all outputs B, in accord with the following PHD model:

$$B_k(A_1, A_2, A_3, \ldots) = X_k^{(F)}(|A_1|)P^k + \Sigma(X_{km}^{(S)}(|A_1|)P^{k-m} \cdot A_m + X_{km}^{(T)}(|A_1|)P^{k+m} \cdot A_m^*) \quad \text{Eq. (6)}$$

where $P = e^{j\Phi(A_1)}$ and $A_m^*$ denotes the conjugate of $A_m$. The summation that appears in Eq. (6) runs on the index m over all ports, where m=1,2, . . . ,N for all ports of a DUT, but for the port to which the imperfect large signal is applied, where m=2, . . . ,N. Again, port indices are neglected in the above equations.

Substituting into Eq. (6) the three sets of input A s from Eqs. (2)-(4), expanding the arguments of the functions, and retaining terms only to first order in $\delta A$ and $\Delta A$, the following function can be obtained (neglecting the superscript "ideal" for simplicity):

$$B_k^{(1)} = X_k^{(F)}(|A_{11}|)P^k + \quad \text{Eq. (7)}$$
$$\sum_{n=1}^{N}\left(X_{kn}^{(S)}(|A_{11}|)P^{k-n} \cdot \delta A_n + X_{kn}^{(T)}(|A_{11}|)P^{k+n} \cdot \delta A_n^*\right)$$

Note the sum now goes from n=1 to N, since:

$$X_{k1}^{(S)}(|A_{11}|) = \frac{\partial X_k^{(F)}}{\partial A_1}\bigg|_{A_1=|A_{11}|}, \quad \text{Eq. (8)}$$

$$X_{k1}^{(T)}(|A_{11}|) = \frac{\partial X_k^{(F)}}{\partial A_1^*}\bigg|_{A_1^*=|A_{11}|}, \quad \text{Eq. (9)}$$

$$B_k^{(2)} = X_k^{(F)}(|A_{11}|)P^k + \quad \text{Eq. (10)}$$
$$\sum_{j=1}^{N}\left(X_{kj}^{(S)}(|A_{11}|)P^{k-j} \cdot \delta A_j + X_{kj}^{(T)}(|A_{11}|)P^{k+j} \cdot \delta A_j^*\right) +$$
$$X_{km}^{(S)}(|A_{11}|)P^{k-m} \cdot \Delta A_m + X_{km}^{(T)}(|A_{11}|)P^{k+m} \cdot \Delta A_m^*, \text{ and}$$

$$B_k^{(3)} = X_k^{(F)}(|A_{11}|)P^k + \quad \text{Eq. (11)}$$
$$\sum_{j=1}^{N}\left(X_{kj}^{(S)}(|A_{11}|)P^{k-j} \cdot \delta A_j + X_{kj}^{(T)}(|A_{11}|)P^{k+j} \cdot \delta A_j^*\right) +$$
$$X_{km}^{(S)}(|A_{11}|)P^{k-m} \cdot e^{-j\pi/2}\Delta A_m + X_{km}^{(T)}(|A_{11}|)P^{k+m}e^{-j\pi/2} \cdot A_m^*.$$

Eqs. (7), (10) and (11) provide $N+2(N)^2$ linear equations (per port) for the X-parameter unknowns $X_{kj}^{(S)}$, $X_{kj}^{(T)}$, and $X_k^{(F)}$, given the known values of $\delta A_k$, $\Delta A_k$, and $A_{11}$, and given the measured values of $B_k^{(1)}$, $B_k^{(2)}$ and $B_k^{(3)}$ for k,m=1, 2, . . . , N. These equations can easily be solved by standard procedures, resulting in the X-parameter functions $X_{kj}^{(S)}$, $X_{kj}^{(T)}$, and $X_k^{(F)}$. In particular, subtracting Eq. (7) from Eqs. (10) and (11), respectively, yields two sets of equations for the $X_{kl}^{(S)}$, $X_{kl}^{(T)}$ functions, for each given harmonic index l. Once these functions are determined, Eq. (7) can be used to solve for $X_k^{(F)}$. This proves the ability to obtain X-parameters (or extract a linearization of a spectral map) for a DUT stimulated with an imperfect large signal.

The steps recited in the preceding paragraph describe one way to carry out the steps 1110 and 1112 of method 1100 (FIG. 11).

Given the above sequence of steps, it is possible to calibrate measurements of DUT response vectors to application of an ideal large signal, despite the fact that the DUT is, in fact, stimulated with an imperfect large signal. This is done by sequentially applying the signals defined by Eqs. (2)-(4) to the DUT, measuring the resulting response vectors $B_k^{(n)}$, n=1, . . . ,$N+2N^2$ (per port), and determining the X-parameters (the functions $X_{kj}^{(S)}$, $X_{kj}^{(T)}$, and $X_k^{(F)}$) of the DUT. Then, the X-parameters are used to determine (e.g., compute) the contribution of undesired spectral components to the imperfect large signal; and the (calibrated) response $B_k^{(corrected)}$ of the DUT, to the ideal large signal $A_{11}$, is determined by subtracting the contribution of the undesired spectral components from the vector response $B_k^{(1)}$, as follows:

$$B_k^{(corrected)} = X_k^{(F)}(|A_{11}|)P^k \quad \text{Eq. (12)}$$
$$= B_k^{(1)} - \sum_{j=1}^{N}\left(X_{kj}^{(S)}(|A_{11}|)P^{k-j} \cdot \delta A_j + X_{kj}^{(T)}(|A_{11}|)P^{k+j} \cdot \delta A_j^*\right)$$

The steps recited in the preceding paragraph describe one way to carry out the steps 1114 and 1116 of method 1100 (FIG. 11). Other ways also exist. For example, instead of measuring spectral components or linearizing the spectral map in the domain of incident and scattered pseudo-waves (or X-parameters), the spectral components can be measured, and the spectral map linearized, in the domain of voltages and currents.

Figure 12:
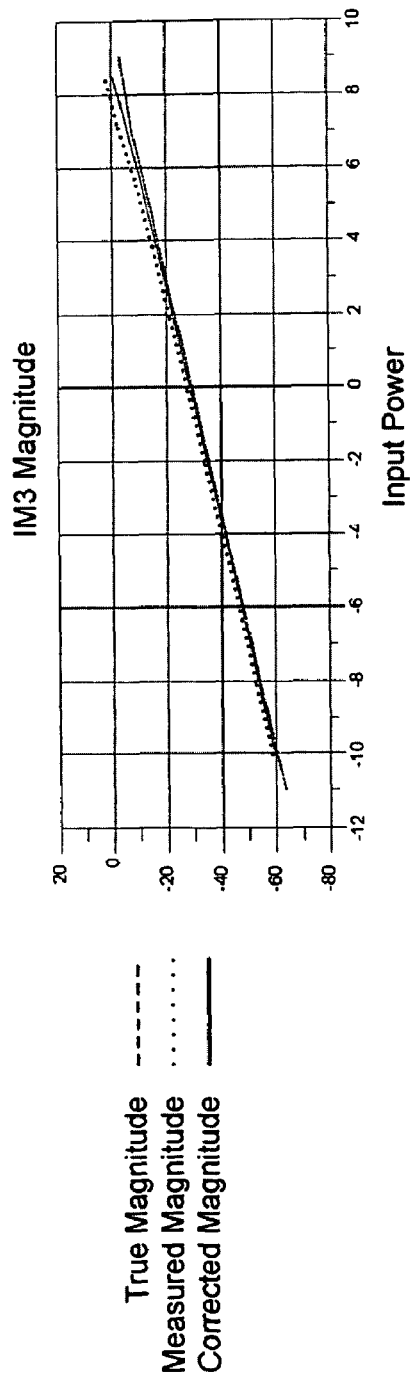
FIG. 12 illustrates exemplary IM3 magnitude corrections using the method shown in FIG. 11.
Figure 13:
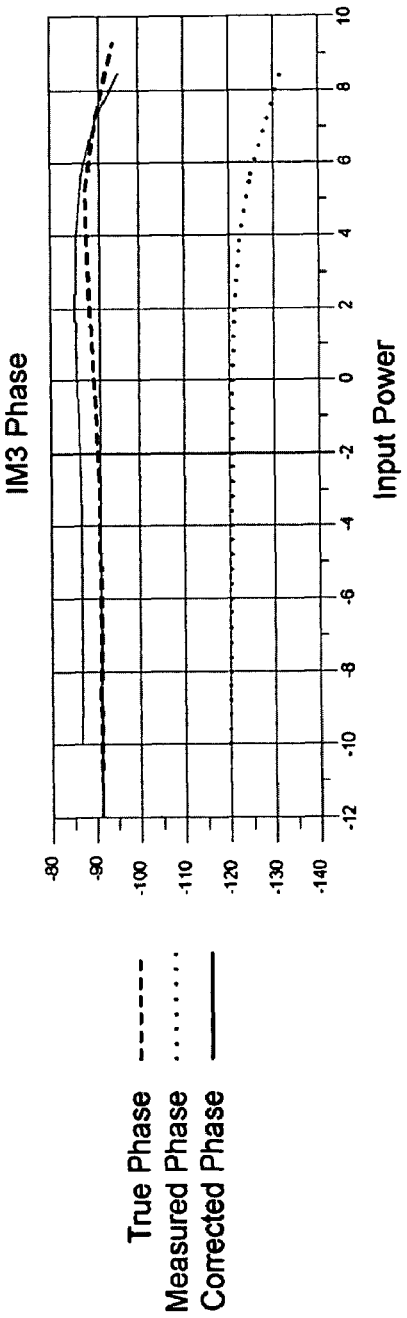
FIG. 13 illustrates exemplary IM3 phase corrections using the method shown in FIG. 11.

Method 1100 can be applied to both real and simulated DUTs and measurement environments. FIGS. 12 and 13 illustrate an exemplary application of method 1100 in a simulated environment. That is, FIGS. 12 and 13 illustrate various measured and corrected responses of a simulated DUT after stimulating the DUT with a simulated "dirty source". The "dirty source" was constructed of a pure two-tone source, passed through a transistor-level model of a real amplifier. The DUT was a transistor-level model of another real amplifier. The graphs shown in FIGS. 12 and 13 plot 1) "true" responses of a DUT, based on stimulating the DUT with an ideal source, 2) "measured" values, which were obtained from the simulated DUT after stimulating it with a simulated dirty source, and 3) "corrected" values, which were obtained by applying the method 1100 (FIG. 11). Power levels shown in FIGS. 12 and 13 are measured in decibels per milliwatt (dBm).

Figure 14:
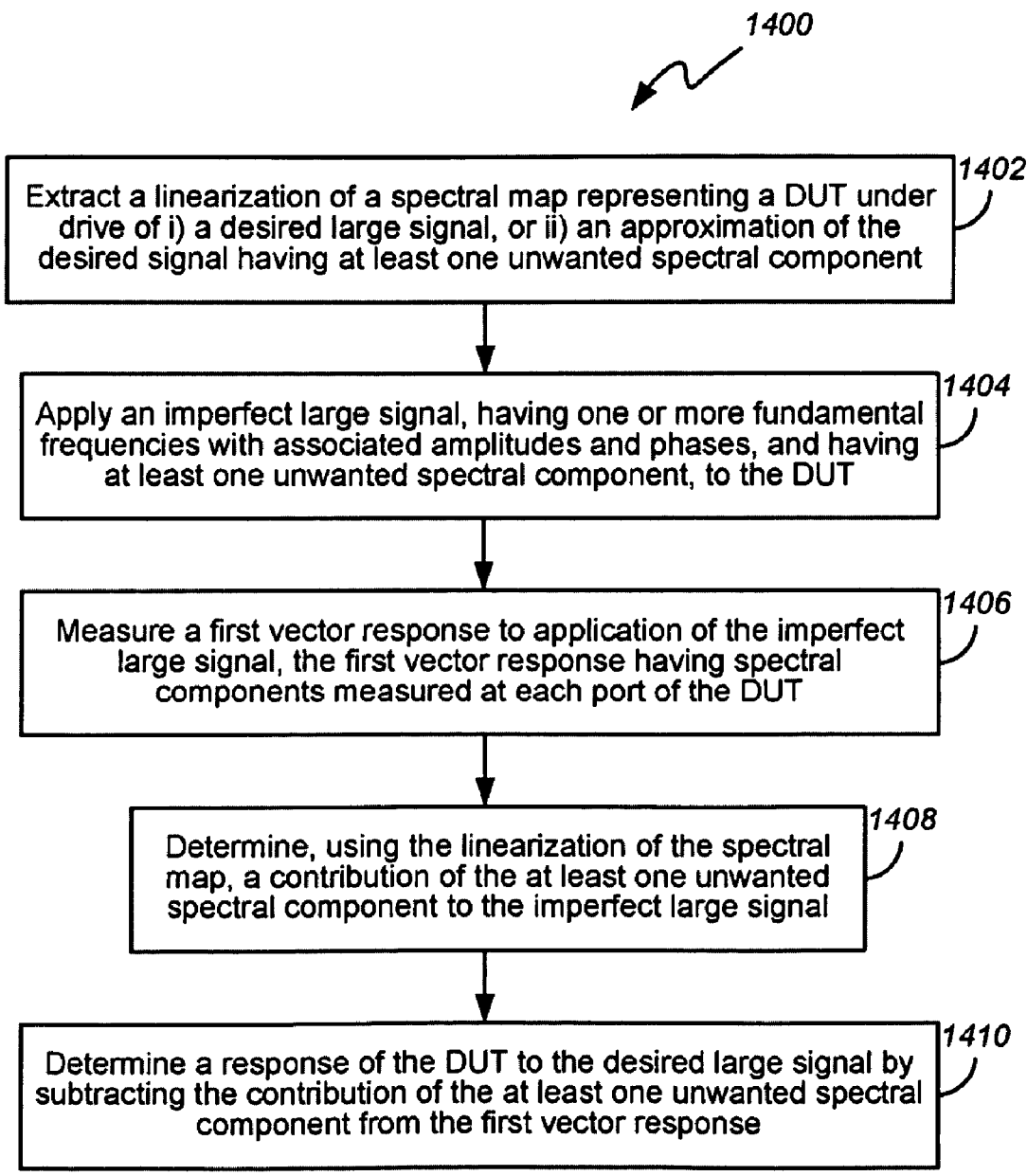
FIG. 14 illustrates a second exemplary method for determining a response of a device under test to a desired large signal.

FIG. 14 illustrates a second exemplary method 1400 for determining a response of a DUT, to a desired large signal having one or more fundamental frequencies with associated amplitudes and phases. The method 1400 begins with the extraction of a linearization of a spectral map representing the DUT, wherein the DUT is under drive of i) the desired large signal, or ii) an approximation of the desired signal having at least one unwanted spectral component (at block 1402). In some cases, the extraction may be performed as set forth in method 1100 or the equations set forth in this description. An imperfect large signal, having one or more fundamental frequencies with associated amplitudes and phases, and having at least one unwanted spectral component, is then applied to the DUT (at block 1404). A first vector response to application of the imperfect large signal is measured (at block 1406), with the first vector response having spectral components measured at each port of the DUT. The linearization of the spectral map is used to determine a contribution of the at least one unwanted spectral component to the imperfect large signal (at block 1408); and a response of the DUT to the desired large signal is determined by subtracting the contribution of the at least one unwanted spectral component from the first vector response (at block 1410).

For each of methods 1100 and 1400, the desired large signal may be, for example, 1) one or more large signals with no energy at harmonic or intermodulation frequencies up to a predetermined order, or 2) a large signal having no components resulting from reflections due to an imperfect load match at one of the ports of the DUT.

Not only can linearization of a spectral map be used to "correct" a DUT response (and remove unwanted spectral components from the response), but linearization of a spectral map can also be used to determine (e.g., compute) the input tones of a dirty source, to cause the source to produce a desired output ("pre-distortion" tones). Considering only a single port, for simplicity, this can be done as follows.

First, a number of small signals are chosen such that the desired output signal is a pure tone at the fundamental frequency. That is:

$$B_k(A_{11}+\Delta A_1, \Delta A_2, \ldots, \Delta A_N) = B_1 \delta_{1k} \quad \text{Eq. (13)}$$

The left-hand side of Eq. (13) can be evaluated using a PHD model, with X-parameters around a one-tone solution, to yield the equation:

$$B_k = X_k^{(F)}(|A_{11}|)P^k + \sum_{j=1}^{N} (X_{kj}^{(S)}(|A_{11}|)P^{k-j} \cdot \Delta A_j + X_{kj}^{(T)}(|A_{11}|)P^{k+j} \cdot \Delta A_j^*)$$

$$= B_1 \delta_{1k} \quad \text{Eq. (14)}$$

At each power level (or value of $|A_{11}|$), these equations can be solved uniquely for the complex numbers $\Delta A_j$. This is always possible because there are 2N real unknowns (the real and imaginary parts of $\Delta A_j$), and N complex knowns.

Figure 15:
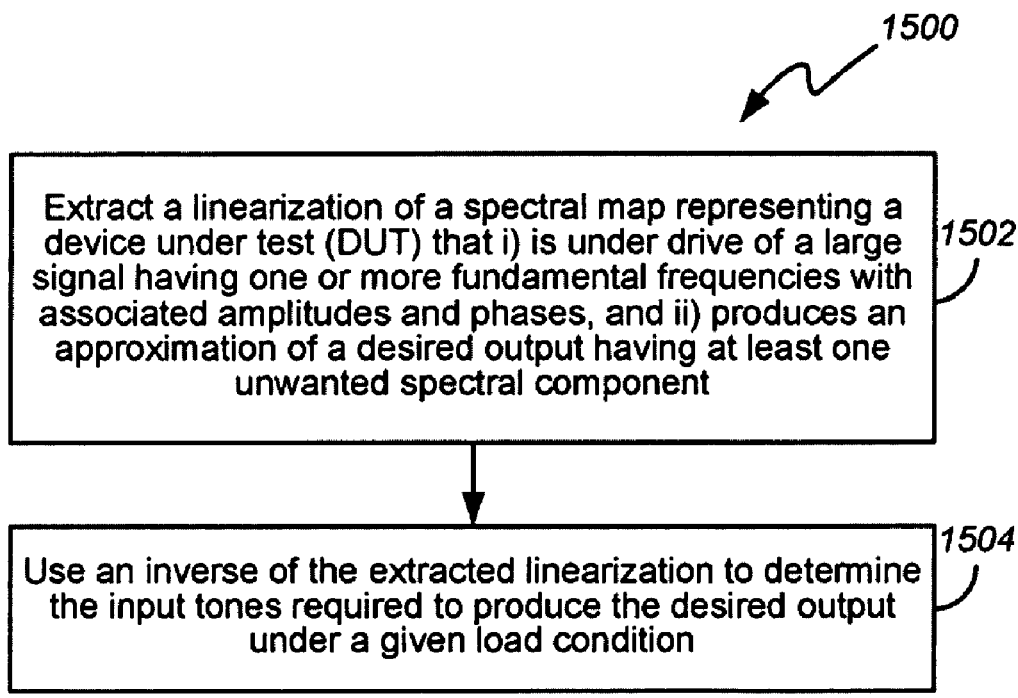
FIG. 15 illustrates an exemplary method for determining input tones required to produce a desired output.

Stated another way, a method 1500 (FIG. 15) for determining the input (pre-distortion) tones required to produce a desired output begins with extracting a linearization of a spectral map (at block 1502). The linearization of the spectral map represents a device under test (DUT) that i) is under drive of a large signal having one or more fundamental frequencies with associated amplitudes and phases, and ii) produces an approximation of a desired output having at least one unwanted spectral component. An inverse of the extracted linearization is then used to determine (e.g., compute) the input tones required to produce the desired output under a given load condition (or power level).

Figure 16:
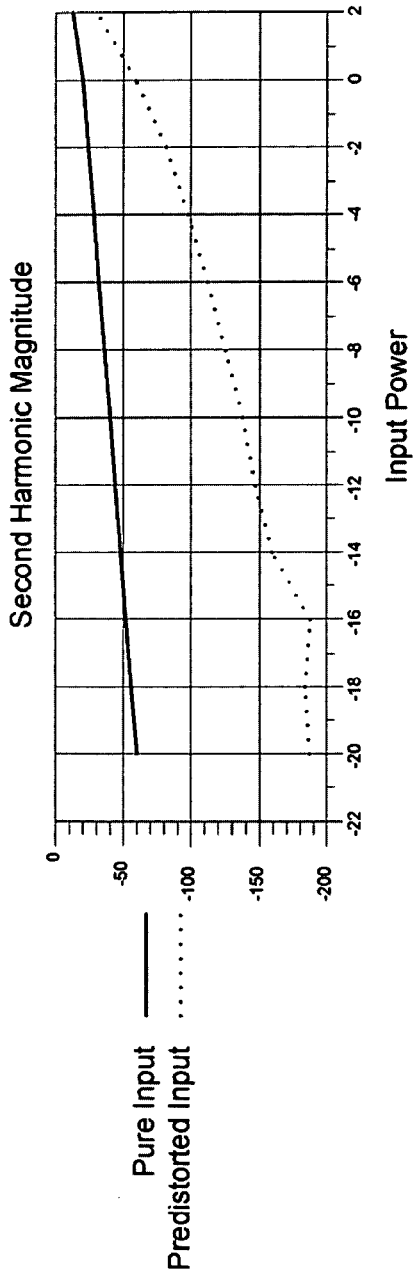
FIG. 16 illustrates exemplary second harmonic magnitude pre-distortion, using the method shown in FIG. 15.
Figure 17:
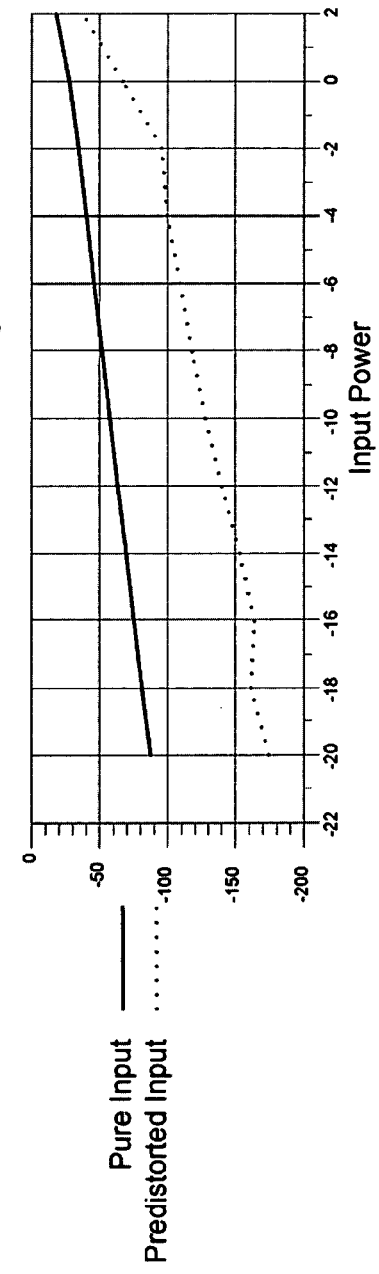
FIG. 17 illustrates exemplary third harmonic magnitude pre-distortion, using the method shown in FIG. 15.

FIGS. 16 and 17 illustrate an exemplary application of the method 1500, wherein the DUT is the amplifier portion of a dirty source. FIGS. 16 and 17 respectively show the output of the amplifier, at the second and third harmonics, with and without pre-distortion of the input tones that are fed to the amplifier. The method 1500 can also be applied, for example, to a mixer (i.e., the DUT), where the desired output is an output that is spur-free within a band of interest.

In summary, the methods disclosed herein can be used to characterize an imperfect or dirty source, and then "pre-distort" it so that it can produce a signal closer to a desired signal. The disclosed methods can also be used to correct the response of a DUT to a signal from a "dirty source", to predict the response from a "clean source". This, in effect, calibrates DUT measurements for errors in the desired input signal. It also allows calibration of a DUT response for imperfections (e.g., departures from purely 50 ohms) at the fundamental input frequency of interest, and also at higher harmonics. Or, in the case of a multiple-tone stimulus, a DUT response can be calibrated for intermodulation products.

The methods described herein require no ad-hoc rules or assumptions, other than that the unwanted spectral components (or imperfections) in a desired signal are small relative to the desired signal. Alternative approaches for calibrating nonlinear instruments use complicated search algorithms to obtain the phase of responses of the system or instrument to perturbations.

In the past, and because source harmonics, even at low power levels, can significantly impact the measurements taken for nonlinear component characterization, only very spectrally pure (and expensive) sources have been capable of producing the stimulus necessary to make high dynamic range measurements (e.g., measurements at a wide range of power levels, including measurements at higher power levels, where spurs at the harmonics would, in the past, have significantly corrupted a source's output). By enabling cancellation or calibration of unwanted spectral components in a stimulus, at all power levels, the methods disclosed herein can enable the production of a "more spectrally pure" stimulus using a "less spectrally pure" (and less expensive) source.

The methods disclosed herein also enable correction or calibration for both source imperfections, as well as reflections due to imperfect load matches at a DUT's ports.

The methods disclosed herein can also be performed relatively quickly. This is at least partly due to the direct measurement of the magnitudes and phases of a DUT's responses, using an instrument such as an NVNA or LSNA.

The methods described herein can be largely implemented via software that controls an NVNA or LSNA instrument to apply signals to, or measure responses of, a DUT. One exemplary embodiment of an NVNA that can be used by the methods disclosed in this description is the VNNA disclosed in U.S. Patent Application Publication 2006/0161409 A1 of Root et al.

What is claimed is:

1. A method of determining a response of a device under test (DUT) to a desired large signal, the method comprising:
    applying an imperfect large signal, having one or more fundamental frequencies with associated amplitudes and phases, and having at least one unwanted spectral component, to the DUT;
    measuring a first vector response to application of the imperfect large signal, the first vector response having spectral components measured at each port of the DUT;
    sequentially applying small signals to each port of the DUT, while continuing to apply the imperfect large signal;
    for each small signal applied, measuring an additional vector response having spectral components measured at each port of the DUT;
    subtracting the first vector response from each additional vector response to produce difference vectors;
    extracting, from the difference vectors, a linearization of a spectral map representing the DUT;
    determining, using the linearization of the spectral map, a contribution of the at least one unwanted spectral component to the imperfect large signal; and
    determining a response of the DUT to the desired large signal by subtracting the contribution of the at least one unwanted spectral component from the first vector response.

2. The method of claim 1, wherein the at least one unwanted spectral component comprises at least one of: a harmonic frequency, an intermodulation frequency, and a reflection due to an imperfect load match at one of the ports of the DUT.

3. The method of claim 1, wherein the spectral components measured at each port of the DUT comprise a vector of incident and scattered pseudo-waves.

4. The method of claim 1, wherein the DUT is a nonlinear device.

5. The method of claim 1, wherein the linearization of the spectral map is extracted in a domain of incident and scattered pseudo-waves.

6. The method of claim 1, wherein the linearization of the spectral map is extracted in a domain of voltages and currents.

7. A method of determining a response of a device under test (DUT) to a desired large signal having one or more fundamental frequencies with associated amplitudes and phases, the method comprising:
    extracting a linearization of a spectral map representing the DUT under drive of i) the desired large signal, or ii) an approximation of the desired large signal and at least one unwanted spectral component;
    applying an imperfect large signal, having one or more fundamental frequencies with associated amplitudes and phases, and having at least one unwanted spectral component, to the DUT;
    measuring a first vector response to application of the imperfect large signal, the first vector response having spectral components measured at each port of the DUT;
    determining, using the linearization of the spectral map, a contribution of the at least one unwanted spectral component to the imperfect large signal; and
    determining a response of the DUT to the desired large signal by subtracting the contribution of the at least one unwanted spectral component from the first vector response.

8. The method of claim 7, wherein the at least one unwanted spectral component comprises at least one of: a harmonic frequency, an intermodulation frequency, and a reflection due to an imperfect load match at one of the ports of the DUT.

9. The method of claim 7, wherein the spectral components measured at each port of the DUT comprise a vector of incident and scattered pseudo-waves.

10. The method of claim 7, wherein the DUT is a nonlinear device.

11. The method of claim 7, wherein the linearization of the spectral map is done in a domain of incident and scattered pseudo-waves.

12. The method of claim 7, wherein the linearization of the spectral map is done in a domain of voltages and currents.

13. The method of claim 7, wherein the desired large signal is one or more large signals with no energy at harmonic or intermodulation frequencies up to a predetermined order.

14. The method of claim 7, wherein the desired large signal has no components resulting from reflections due to an imperfect load match at one of the ports of the DUT.

15. A method for determining input tones required to produce a desired output, the method comprising:
    extracting a linearization of a spectral map representing a device under test (DUT) that i) is under drive of a large signal having one or more fundamental frequencies with associated amplitudes and phases, and ii) produces an approximation of a desired output and at least one unwanted spectral component; and
    using an inverse of the extracted linearization to determine the input tones required to produce the desired output under a given load condition.

16. The method of claim 15, wherein the DUT is an amplifier and the desired output is a spectrally pure large signal having one or more fundamental frequencies with associated amplitudes and phases.

17. The method of claim 15, wherein the DUT is a mixer and the desired output is an output that is spur-free within a band of interest.

18. The method of claim 15, wherein the at least one unwanted spectral component comprises at least one of: a harmonic frequency, and an intermodulation frequency.

19. The method of claim 15, wherein the DUT is a nonlinear device.

20. The method of claim 15, wherein the linearization of the spectral map is done in a domain of incident and scattered pseudo-waves.

* * * * *